United States Patent
Niu

(10) Patent No.: US 10,162,104 B2
(45) Date of Patent: Dec. 25, 2018

(54) DISPLAY PANEL FIXING FRAME AND DISPLAY DEVICE

(71) Applicants: BOE TECHNOLOGY GROUP CO., LTD., Beijing (CN); BEIJING BOE MULTIMEDIA TECHNOLOGY CO., LTD., Beijing (CN)

(72) Inventor: Enmin Niu, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 459 days.

(21) Appl. No.: 14/894,223

(22) PCT Filed: Jul. 17, 2015

(86) PCT No.: PCT/CN2015/084326
§ 371 (c)(1),
(2) Date: Nov. 25, 2015

(87) PCT Pub. No.: WO2016/141656
PCT Pub. Date: Sep. 15, 2016

(65) Prior Publication Data
US 2018/0120499 A1    May 3, 2018

(30) Foreign Application Priority Data

Mar. 12, 2015  (CN) .................... 2015 2 0141501 U

(51) Int. Cl.
*H04N 5/56*     (2006.01)
*F21V 8/00*     (2006.01)
(Continued)

(52) U.S. Cl.
CPC ......... *G02B 6/0091* (2013.01); *G02B 6/0031* (2013.01); *G02B 6/0085* (2013.01);
(Continued)

(58) Field of Classification Search
None
See application file for complete search history.

(56) References Cited

U.S. PATENT DOCUMENTS

| 2006/0156605 A1* | 7/2006 | Abrams | A47G 1/0655 40/781 |
| 2013/0106783 A1* | 5/2013 | Shang | G06F 3/0304 345/175 |
| 2014/0184929 A1  | 7/2014 | Nakamura | |

FOREIGN PATENT DOCUMENTS

| CN | 1673826 A    | 9/2005 |
| CN | 101140373 A  | 3/2008 |

(Continued)

OTHER PUBLICATIONS

International Search Report & Written Opinion Appln. No. PCT/CN2015/084326; dated Sep. 25, 2015.

*Primary Examiner* — Eileen M Adams
(74) *Attorney, Agent, or Firm* — Ladas & Parry LLP

(57) ABSTRACT

A display panel fixing frame includes a front housing for surrounding the front edge part of the display panel and a back housing for covering the rear side of the display panel. A lateral part of the front housing is adjacent to a lateral part of the back housing, and the lateral part of the front housing and the lateral part of the back housing are fixed with each other by snap-fit.

20 Claims, 4 Drawing Sheets

(51) Int. Cl.
*H04N 5/655* (2006.01)
*H05K 7/18* (2006.01)
*G02F 1/1333* (2006.01)
*G02F 1/1335* (2006.01)

(52) U.S. Cl.
CPC ...... *G02F 1/1335* (2013.01); *G02F 1/133308* (2013.01); *H04N 5/655* (2013.01); *H05K 7/18* (2013.01); *G02F 2001/13332* (2013.01); *G02F 2001/133322* (2013.01); *G02F 2201/46* (2013.01)

(56) References Cited

FOREIGN PATENT DOCUMENTS

| KR | 20100002885 A | 3/2010 |
|----|---------------|--------|
| WO | 2012169268 A1 | 12/2012 |

* cited by examiner

DISPLAY PANEL FIXING FRAME AND DISPLAY DEVICE

TECHNICAL FIELD

The present application relates to a display panel fixing frame and a display device.

BACKGROUND

In recent years, along with the rapid development of the panel display technique, liquid crystal displays are widely used in various information, communication and consumer products because of their small volume, light weight, high image quality, low driving voltage and other advantages.

As shown in FIG. 1, a display device in prior art comprises a front housing 1 for surrounding the front edge part of the display panel 3, and a back housing 2 for covering the rear side of the display panel 3, and the display panel 3 is arranged in a display panel fixing frame composed of the front housing 1 and the back housing 2.

The inventor has found that at least the following problems exist in prior art. In order to seek thin-sized design, most of display devices such as advanced liquid crystal televisions employ a metal back housing 2. The metal back housing 2 has a large size and a heavy weight, thus the back housing 2 needs to be fixed by back housing screws 21. Therefore, a plurality of screw holes having different sizes are needed to be punched on the back housing 2 of the display panel 3 for fixing the back housing 2 on the display panel 3 or other components by screw locking, in which case the appearance of the product would be influenced.

SUMMARY

A plurality of screw holes needs to be punched on a back housing of a prior display device for the reason that the back housing is fixed with a display panel by screws, which affects the appearance of the product. The present application aims at this problem and provides a display panel fixing frame.

The technical solutions to solve the technical problem of the present application are as follows.

A display panel fixing frame, comprising a front housing and a back housing, wherein a lateral part of the front housing is adjacent to a lateral part of the back housing, and the lateral part of the front housing and the lateral part of the back housing are fixed with each other by snap-fit. In this application, the term "lateral part" is also known as "lateral side". The lateral part or lateral side is defined relative to the front side of the front housing or back housing. The front side corresponds to the side of a display device facing towards or backwards the user when the display panel operates normally. Because the lateral part is bended relative to the front side, the "lateral part" is also known as the bending part of the front housing or back housing.

In some embodiments, the front housing surrounds the front edge part of the display panel. In some embodiments, the back housing covers the rear side of the display panel.

In some embodiments, one of the two adjacent lateral parts of the front housing and the back housing is a first lateral part, and the other is a second lateral part. At least one elastic plate is arranged at the first lateral part. The middle part of the elastic plate is bended such that a convex engagement holder is formed to protrude towards the second lateral part. An engagement hole, which is matched with the convex engagement holder of the elastic plate, is arranged at the second lateral part. The convex engagement holder of the elastic plate is fixed with the engagement hole by snap-fit. In some embodiments, the elastic plate arranged on the first lateral part and the direction perpendicular to the display panel forms an angle of less than or equal to 60 degree, such as an angle of less than or equal to 45 degree, such as an angle of less than or equal to 30 degree, such as an angle of less than or equal to 10 degree. In some embodiments, the elastic plate arranged on the first lateral part is in the direction perpendicular to the display panel, and two ends of the elastic plate are fixed on two ends of the first lateral part, respectively.

In some embodiments, at least one elastic plate is arranged at the second lateral part. The middle part of the elastic plate is bended such that a convex engagement holder is formed to protrude towards the first lateral part. An engagement hole, which is matched with the convex engagement holder of the elastic plate arranged at the second lateral part, is arranged at the first lateral part. The convex engagement holder of the elastic plate arranged at the second lateral part is fixed with the engagement hole arranged at the first lateral part by snap-fit. In some embodiments, the elastic plate arranged on the second lateral part forms an angle of less than or equal to 60 degree, such as an angle of less than or equal to 45 degree, such as an angle of less than or equal to 30 degree, such as an angle of less than or equal to 10 degree, with the direction perpendicular to the display panel. In some embodiments, the elastic plate arranged on the second lateral part is in the direction perpendicular to the display panel, and two ends of the elastic plate arranged at the second lateral part are fixed on two ends of the second lateral part.

In some embodiments, the second lateral part is not provided with the elastic plate. Correspondingly, the first lateral part is not provided with the engagement hole.

In some embodiments, the second lateral part is arranged inside the first lateral part.

In some embodiments, through holes are arranged on two ends of the elastic plate in the direction perpendicular to the display panel, and the elastic plate is fixed at the first lateral part though screws penetrating the through holes.

In some embodiments, engagement locks are arranged on two ends of the first lateral part in the direction perpendicular to the display panel, the engagement locks protrude towards the second lateral part, and the elastic plate is engaged between the two engagement locks.

In some embodiments, in the direction perpendicular to the display panel, two ends of the first lateral part at the engagement locks are arranged to have two U-shaped cross sections having opposite opening; and two ends of the elastic plate are inserted into the "U" shapes of the two ends of the first lateral part, respectively.

In some embodiments, the elastic plate is made of a metal material.

In some embodiments, the convex engagement holder has an arc-shape or a bend-shape.

In some embodiments, the length of the elastic plate arranged on the first lateral part is 1.5 to 2 times larger than the width of the first lateral part. As used herein, the length of the elastic plate arranged on the first lateral part means the length of the elastic plate extending in the direction perpendicular to the display panel. As used herein, the width of the first lateral part means the length or distance of the first lateral part extending in the direction perpendicular to the display panel.

The present application also provides a display device, comprising the above-mentioned display panel fixing frame and a display panel fixed within the display panel fixing frame.

In some embodiment, a plurality of elastic plates may be arranged at two adjacent lateral parts of the front housing and back housing to fix the four edges of the display panel fixing frame sufficiently. In some embodiments, the plurality of elastic plates is arranged in the direction perpendicular to the display panel.

In some embodiment, the plurality of elastic plates is arranged in different directions. In this design, the plurality of elastic plates arranged in different directions can sufficiently fix the front housing with the back housing in more directions. In some embodiments, at least one of the plurality of elastic plates is arranged in the direction perpendicular to the display panel. In some embodiments, the first lateral part is a hexahedron which has a rectangular cross section, and the first lateral part has an upper lateral part, a lower lateral part, a left lateral part and a right lateral part, wherein, the elastic plate arranged on the upper lateral part of the first lateral part is same as the elastic plate arranged on the lower lateral part of the first lateral part, and/or the elastic plate arranged on the left lateral part of the first lateral part is same as the elastic plate arranged on the right lateral part of the first lateral part. As used herein, "the same" means that not only the relative positions and directions of the elastic plates but also the sizes thereof are the same. In some embodiments, the engagement holes corresponding to the same elastic plates are also the same. This design enables the display device to accept a uniform force during transport or use, thereby extending the service life of the fixing frame.

The present application may achieve the following beneficial effects.

In the display panel fixing frame of the present application, the hook structure formed by using a metal elastic plate instead of the traditional back housing screw fixing not only enhances the aesthetic feeling of appearance and the design highlight of the display device product, but also increases the assembly operation efficiency of the product line. The display panel fixing frame can be easily mounted and detached.

The display panel fixing frame of the present application is suitable for various display devices, and especially suitable for ultra thin liquid crystal televisions with large sizes and heavy weights, etc.

BRIEF DESCRIPTION OF THE DRAWINGS

In order to illustrate the technical solutions of the embodiments of the present invention more clearly, the figures of the embodiments are briefly described below. Apparently, the figures described below merely relate to some embodiments of the present invention rather than are limitative of the present invention.

Figure 1:
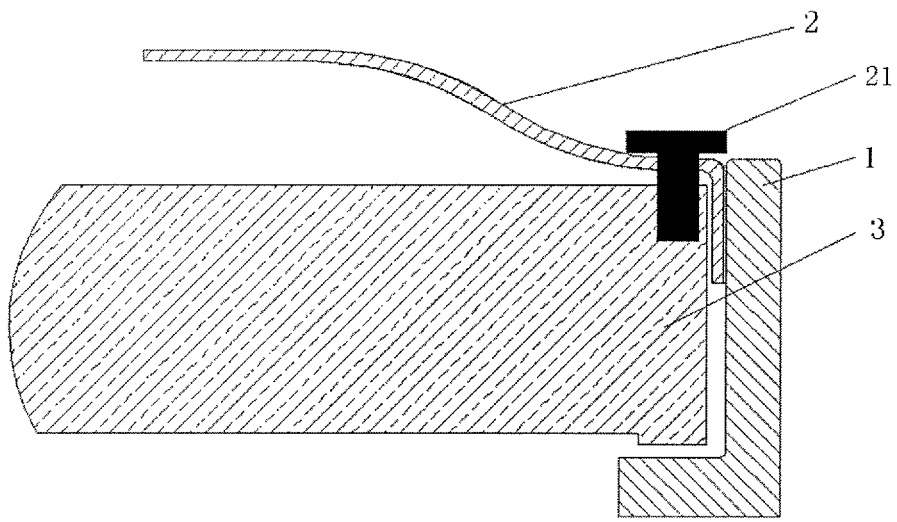
FIG. 1 is a sectional view of the screw fixing of the back housing of a prior display panel in the direction perpendicular to the display panel.
Figure 2:
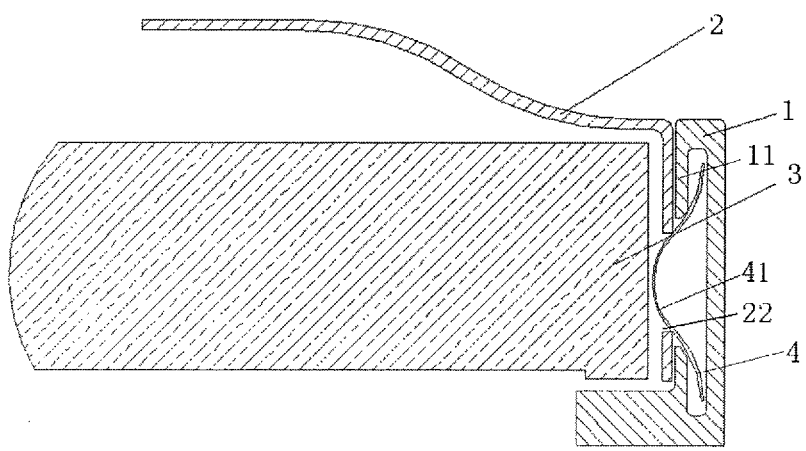
FIG. 2 is a sectional view of an display panel fixing frame of embodiment 2 of the present application in the direction perpendicular to the display panel.
Figure 3:
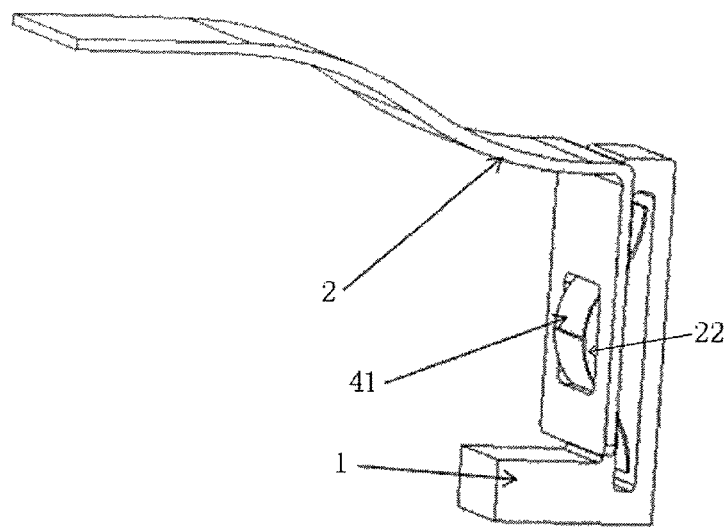
FIG. 3 is a schematic view of a snap-fit of embodiment 2 of the present application.

In the figures, reference signs on the figures are: 1—front housing; 11—engagement lock; 2—back housing; 21—back housing screw; 22—engagement hole; 3—display panel; 4—elastic plate; 41—convex engagement holder; 42—elastic plate screw.

DETAILED DESCRIPTION

To make the object, technical solutions, and advantages of the embodiments of the present invention clearer, the technical solutions of the embodiments of the present invention will be described below in a clearer and more complete way with reference to the figures of the embodiments of the present invention. Apparently, the embodiments described are only part, rather than all of the embodiments of the present invention. Based on the embodiments of the present invention described, all the other embodiments obtained by a person of ordinary skills in the art without paying inventive work fall into the scope of protection of the present invention.

Embodiment 1

This embodiment provides a display panel fixing frame, which comprises a front housing for surrounding a front edge part of the display panel, and a back housing for covering a rear side of the display panel. A lateral part of the front housing is adjacent to a lateral part of the back housing, and the lateral part of the front housing and the lateral part of the back housing are fixed with each other by snap-fit.

The display panel fixing frame of this embodiment can be easily mounted and detached. The use of hook structure instead of the traditional back housing screw fixing not only enhances the aesthetic feeling of appearance and the design highlight of the display device product, but also increases the assembly operation efficiency of the product line.

Embodiment 2

This embodiment provides a display panel fixing frame, which comprises, as shown in FIGS. 2-6, a front housing 1 for surrounding a front edge part of the display panel 3, and a back housing 2 for covering a rear side of the display panel 3. A lateral part of the front housing 1 is adjacent to a lateral part of the back housing 2.

In some embodiments, one of the two adjacent lateral parts of the front housing 1 and the back housing 2 is a first lateral part, and the other is a second lateral part. Furthermore, in some embodiments, the lateral part of the front housing 1 is the first lateral part, and the lateral part of the back housing 2 is the second lateral part.

The reason of such arrangement is that the elastic plate 4 is arranged at the first lateral part of the display panel fixing frame according to the present embodiment. Generally, the lateral part of the front housing 1 has a larger thickness, thus is more suitable for the elastic plate 4 to be arranged therein.

In some embodiments, at least one elastic plate 4 is arranged at the lateral part of the front housing 1. The elastic plate 4 has a larger length than the width of the lateral part of the front housing 1 in the direction perpendicular to the display panel 3. Furthermore, in this direction, two ends of the elastic plate 4 are fixed at the two ends of the lateral part of the front housing 1, and the middle part of the elastic plate 4 is bended such that a convex engagement holder 41 is formed to protrude towards the lateral part of the back housing 2. An engagement hole 22, which is matched with the convex engagement holder 41, is arranged at the lateral part of the back housing 2. The convex engagement holder 41 of the elastic plate 4 is fixed with the engagement hole 22 at the lateral part of the back housing 2 by snap-fit.

That is, an elastic plate 4 is arranged at the lateral part of the front housing 1. The elastic plate 4 has a larger length than the width of the lateral part of the front housing 1 in the thickness direction of the display panel 3 such that the elastic plate 4 can be bended to form a convex engagement holder 41 which protrudes towards the lateral part of the back housing 2. An engagement hole 22 is arranged at the lateral part of the back housing 2. The convex engagement holder 41 is inserted into the engagement hole 22 to fix the front housing 1 with the back housing 2. The length of the elastic plate 4 in this application means the length of the stretched elastic plate, and the width of the lateral part means the size of the lateral part in the thickness direction of the display panel, that is, in the direction perpendicular to the display panel.

According to the above design of the elastic plate 4, after the elastic plate 4 is arranged at the lateral part of the front housing 1, the elastic plate 4 can be deformed only by push the back housing 2 towards the front housing 1 gradually, thereby sliding into the engagement hole 22 at the lateral side of the back housing 2, thus finally the front housing 1 and the back housing 2 are fixed with each other. Screws are not used in this fixing method, thereby enhancing the aesthetic feeling of appearance and the design highlight of the display device product while increasing the assembly operation efficiency of the product line, and it can be easily mounted and detached.

In some embodiments, the lateral part of the back housing 2 of the display device is arranged inside the lateral part of the front housing 1. That is, the lateral part of the back housing 2 is contained inside the lateral part of the front housing 1.

This is because the front side of the display device is viewed by people more typically and the front housing 1 containing the back housing 2 is more aesthetically pleasing. Meanwhile, as stated above, the convex engagement holder 41 of the elastic plate 4 is protruded into the engagement hole 22 of the back housing 2 from the front housing 1, thus the back housing 2 is located inside such that it would not be exposed, in which case the display device has also an aesthetic appearance.

Figure 4:
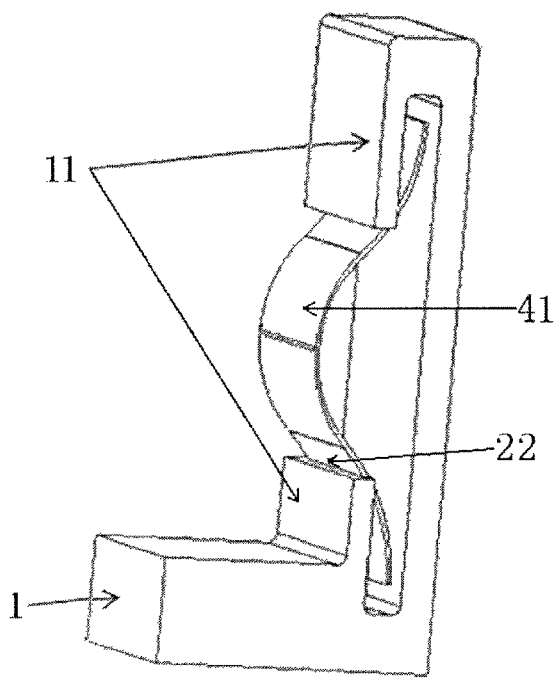
FIG. 4 is a schematic view of a shape of an elastic plate of embodiment 2 of the present application.

As an implement of this embodiment, as shown in FIG. 4, engagement locks 11 are arranged on both ends of the lateral part of the front housing 1 in the direction perpendicular to the display panel 3 and protruded inwards. The elastic plate 4 is engaged and fixed between the two engagement locks.

In some embodiments, two ends of the lateral part of the front housing 1 are arranged to have two oppositely opened U-shaped cross sections (that is, two U-shaped cross sections having U-shaped cross sections) at the engagement locks, that is, the ends of the engagement locks are bended inwards and both ends of the elastic plate 4 are inserted into the two oppositely opened "U" shapes respectively such that the elastic plate 4 is fixed.

In some embodiments, two ends of the lateral part of the front housing 1 are arranged to be the "U" shapes that can just contain two ends of the elastic plate 4. The elastic plate 4 can be fixed just by inserting two ends of the elastic plate 4 into the two oppositely opened "U" shapes respectively. Such ends having a "U" shapes can prevent the elastic plate 4 from disengaging from the engagement lock 11 in a better way and can define the convex position of the convex engagement holder 41.

The above-mentioned fixing manner in which the elastic plate 4 is fixed by the engagement lock 11 can facilitate the mounting thereof and is suitable for assembly line work.

Figure 5:
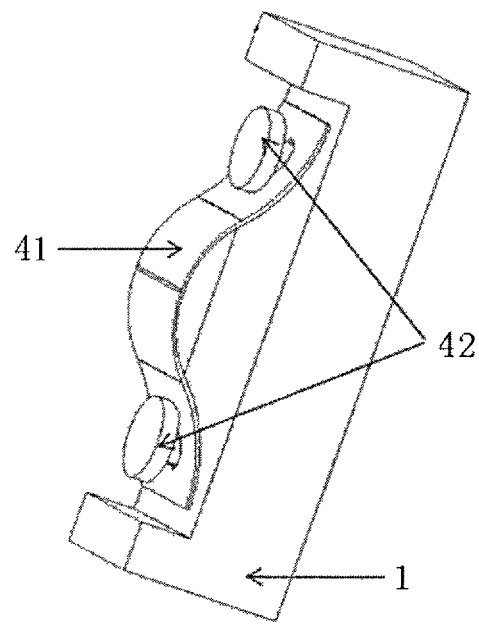
FIG. 5 is a schematic view of an elastic plate fixing of embodiment 2 of the present application.

As another implement of this embodiment, the above-mentioned fixing manner of the elastic plate 4 may not be used. Instead, as shown in FIG. 5, through holes are arranged on two ends of the elastic plate 4 in the direction perpendicular to the display panel 3, and the elastic plate 4 is fixed at the lateral part of the front housing 1 though screws 42 penetrating the through holes 4. That is, two elastic plate screws 42 are used to fix two ends of the elastic plate 4 on the lateral part of the front housing 1.

This fixing manner is more firm. Moreover, during the long-term use of the display device, even though in the case that they are damaged, the elastic plate screws 42 or the elastic plate 4 may be replaced timely.

In some embodiments, two ends of the lateral part of the front housing are arranged to have two oppositely opened U-shaped cross sections (that is, two U-shaped cross sections having U-shaped cross sections) at the engagement locks in the direction perpendicular to the display panel 3, that is, the ends of the engagement locks are bended inwards and two ends of the elastic plate are inserted into the "U" shapes of two ends of the lateral part of the front housing respectively such that the elastic plate is fixed. Meanwhile, through holes are arranged on two ends of the elastic plate 4 in the direction perpendicular to the display panel, and through holes are also correspondingly arranged on the front housing. The elastic plate is fixed at the lateral part of the front housing though screws penetrating the through holes.

In some embodiments, in the direction perpendicular to the display panel 3, the length of the elastic plate 4 is 1.2 to 2.5 times, such as 1.5 to 2 times, larger than the width of the lateral part of the front housing 1.

That is, the length of the elastic plate 4 needs to be set according to the lateral part of the front housing 1 and the shape thereof. For example, when the "U" shapes of the two ends of the lateral part of the front housing 1 are relatively long, the elastic plate 4 may be shortened relatively.

That is because the length of the elastic plate 4 may influence the fixing tightness between the front housing 1 and the back housing 2. When the back housing 2 are gradually pressed towards the front housing 1, the elastic plate 4 is difficult to be engaged if the elastic plate 4 is too long. Conversely, the front housing 1 and the back housing 2 tend to be loosed if the elastic plate 4 is too short.

In some embodiments, as shown in FIG. 4, the convex engagement holder 41 of the elastic plate 4 is arc-shaped.

That is, the length of the elastic plate 4 is larger than the width of the first lateral part. After both ends of the elastic plate 4 are fixed on the lateral part of the front housing 1, an arc of certain elasticity will be formed naturally such that the arc-shaped elastic plate 4 tends to slide smoothly into the engagement holes 22 at the lateral part of the back housing 2.

Figure 6:
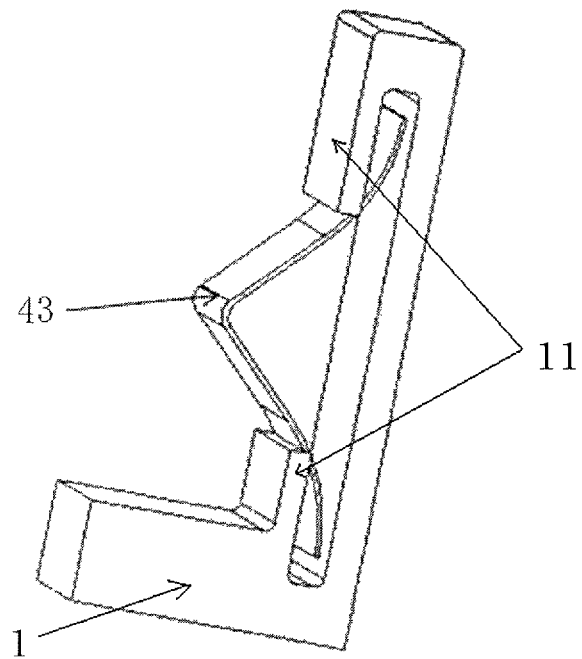
FIG. 6 is a schematic view of a shape of an elastic plate of embodiment 2 of the present application.

In some embodiments, as another implement of this embodiment, the convex engagement holder 41 can also be in the form of buckle as shown in FIG. 6.

In some embodiments, the elastic plate 4 is made of a metal material.

This is because a metal material can achieve the strength required for fixing the front housing 1 and the back housing 2 and a metal material has excellent toughness and elasticity and are firm and durable.

Figure 7:
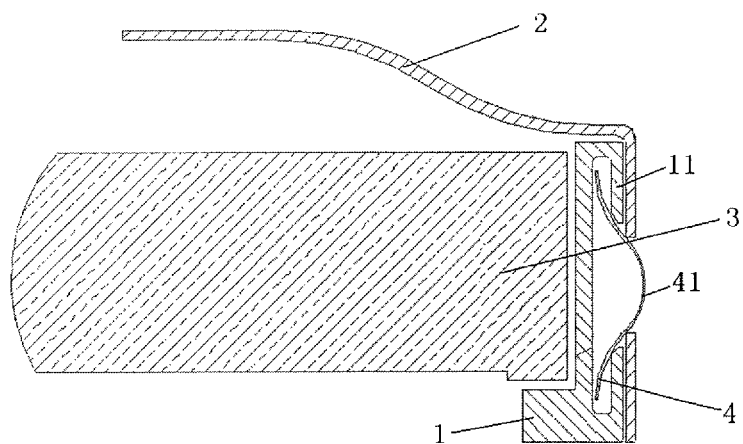
FIGS. 7 and 8 are schematic views of a display panel fixing frame of the present application.

Certainly, in this embodiment, it is also feasible that the front housing 1 is arranged inside and the back housing 2 is arranged outside, as shown in FIG. 7. Certainly, the elastic plate 4 may be exposed in this way and the use thereof is not influenced. Moreover, the exposed elastic plate 4 can be detached more easily.

Figure 8:
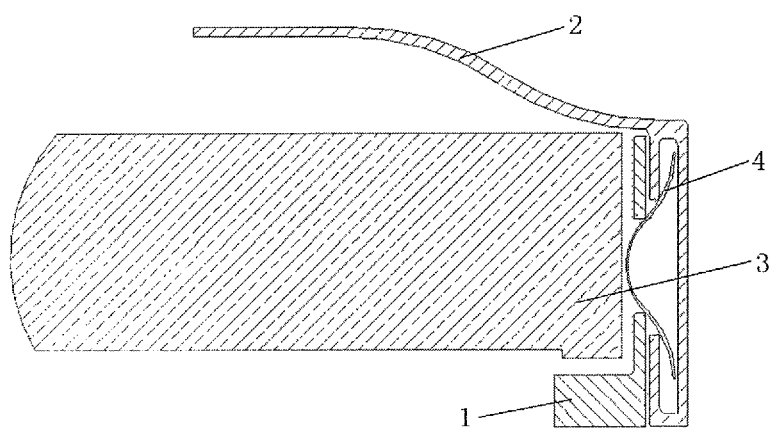

Meanwhile, it should be understood that it is also feasible that the lateral part of the back housing 2 is the first lateral part while the lateral part of the front housing 1 is the second lateral part, as shown in FIG. 8, because the front housing 1 and the back housing 2 are only relative to the display panel 3 and there is no implicit difference at the lateral position for the two housings.

Embodiment 3

This embodiment provides a display device, which comprises any one above-mentioned display panel fixing frame and a display panel fixed therein. The display device may be any product or component having display function, such as electronic paper, mobile phone, tablet computer, TV set, display, notebook computer, digital photo frame, navigator, etc.

The above description is merely exemplary embodiments which are not used for limiting the protection scope of the present invention which is, however, determined by the attached claims.

The present application claims the priority of the Chinese Patent Application No. 201520141501.1 submitted on Mar. 12, 2015, and the content disclosed in the above Chinese patent application is incorporated by reference as part of this application.

What is claimed is:

1. A display panel fixing frame for a display panel, the display panel comprising a front side and a back side which are opposite to each other and comprising a lateral side which connects the front side and the back side,
   wherein the display panel fixing frame comprises a front housing and a back housing, the front housing is configured to surround an edge part of the front side of the display panel and the back housing is configured to cover the back side of the display panel,
   wherein a lateral part of the front housing and a lateral part of the back housing face the lateral side of the display panel and overlap with each other in a direction perpendicular to the lateral side of the display panel, and the lateral part of the front housing and the lateral part of the back housing are fixed with each other by snap-fit.

2. A display device, comprising the display panel fixing frame defined according to claim 1 and a display panel fixed within the display panel fixing frame.

3. The display device defined according to claim 2, wherein, one of the lateral part of the front housing and the lateral part of the back housing is a first lateral part, and the other is a second lateral part; at least one elastic plate is arranged at the first lateral part; a middle part of the elastic plate is bended such that a convex engagement holder is formed to protrude towards the second lateral part; an engagement hole, which is matched with the convex engagement holder of the elastic plate, is arranged at the second lateral part; and the convex engagement holder of the elastic plate is fixed with the engagement hole by snap-fit.

4. The display device defined according to claim 3, wherein, the second lateral part is arranged inside the first lateral part.

5. The display device defined according to claim 3, wherein, through holes are arranged on two ends of the elastic plate in a direction perpendicular to the display panel, and the elastic plate is fixed at the first lateral part though screws penetrating the through holes.

6. The display device defined according to claim 3, wherein, engagement locks are arranged on two ends of the first lateral part in a direction perpendicular to the display panel, the engagement locks protrude towards the second lateral part, and the elastic plate is engaged between two engagement locks.

7. The display device defined according to claim 6, wherein, in the direction perpendicular to the display panel, two ends of the first lateral part at the engagement locks are arranged to have two U-shaped cross sections that have opposite openings; and two ends of the elastic plate are inserted into the "U" shapes of the two ends of the first lateral part, respectively.

8. The display device defined according to claim 3, wherein, the elastic plate is made of a metal material.

9. The display device defined according to claim 3, wherein, the convex engagement holder has an arc-shape or a bend-shape.

10. A display panel fixing frame, comprising a front housing and a back housing, wherein a lateral part of the front housing is adjacent to a lateral part of the back housing, and the lateral part of the front housing and the lateral part of the back housing are fixed with each other by snap-fit,
    wherein, one of the lateral part of the front housing and the lateral part of the back housing is a first lateral part, and the other is a second lateral part; at least one elastic plate is arranged at the first lateral part; a middle part of the elastic plate is bended such that a convex engagement holder is formed to protrude towards the second lateral part; an engagement hole, which is matched with the convex engagement holder of the elastic plate, is arranged at the second lateral part; and the convex engagement holder of the elastic plate is fixed with the engagement hole by snap-fit.

11. The display panel fixing frame defined according to claim 10, wherein, the second lateral part is arranged inside the first lateral part.

12. The display panel fixing frame defined according to claim 10, wherein, through holes are arranged on two ends of the elastic plate in a direction perpendicular to the display panel, and the elastic plate is fixed at the first lateral part though screws penetrating the through holes.

13. The display panel fixing frame defined according to claim 10, wherein, engagement locks are arranged on two ends of the first lateral part in a direction perpendicular to the display panel, the engagement locks protrude towards the second lateral part, and the elastic plate is engaged between two engagement locks.

14. The display panel fixing frame defined according to claim 13, wherein, in the direction perpendicular to the display panel, two ends of the first lateral part at the engagement locks are arranged to have two U-shaped cross sections that have opposite openings; and two ends of the elastic plate are inserted into the "U" shapes of the two ends of the first lateral part, respectively.

15. The display panel fixing frame defined according to claim 10, wherein, the elastic plate is made of a metal material.

16. The display panel fixing frame defined according to claim 10, wherein, the convex engagement holder has an arc-shape or a bend-shape.

17. The display panel fixing frame defined according to claim 10, wherein, in a direction perpendicular to the display panel, the elastic plate arranged on the first lateral part has a length of 1.5 to 2 times larger than the width of the first lateral part.

18. The display panel fixing frame defined according to claim 10, wherein, the elastic plate arranged on the first lateral part is in a direction perpendicular to the display panel; and two ends of the elastic plate are fixed on two ends of the first lateral part, respectively.

19. The display panel fixing frame defined according to claim 10, wherein, the first lateral part is a hexahedron and has an upper lateral part, a lower lateral part, a left lateral part and a right lateral part; and wherein, the elastic plate arranged on the upper lateral part of the first lateral part is same as the elastic plate arranged on the lower lateral part of the first lateral part, and/or the elastic plate arranged on the left lateral part of the first lateral part is same as the elastic plate arranged on the right lateral part of the first lateral part.

20. A display device, comprising the display panel fixing frame defined according to claim 10 and a display panel fixed within the display panel fixing frame.

* * * * *